Oct. 29, 1968 P. MROZEK 3,408,510
SOLID STATE WAVE AMPLITUDE LIMITING DEVICE
Filed April 7, 1965 2 Sheets-Sheet 1

INVENTOR.
PAWEL MROZEK
BY
Edward J. Norton
Attorney

Oct. 29, 1968 P. MROZEK 3,408,510

SOLID STATE WAVE AMPLITUDE LIMITING DEVICE

Filed April 7, 1965 2 Sheets-Sheet 2

INVENTOR.
PAWEL MROZEK
BY Edward J. Norton
Attorney 3,408,510

SOLID STATE WAVE AMPLITUDE LIMITING DEVICE

Pawel Mrozek, Washington, Pa., assignor to Radio Corporation of America, a corporation of Delaware Filed Apr. 7, 1965, Ser. No. 446,293
6 Claims. (Cl. 307—237)

ABSTRACT OF THE DISCLOSURE

A solid state wave amplitude limiting device in which a diode is connected to the base of a linear transistor amplifier. The quiescent D.C. diode current and the quiescent D.C. base current flow through a base biasing resistor. On large amplitude input signal excursions in one direction, the diode current substantially doubles and the base current is clipped. On large amplitude input signal excursions in the opposite direction, the diode current and base current are both clipped. An amplified voltage replica of the base current appears in the transistor amplifier output.

The present invention relates to amplitude limiters for electric wave signals, and more particularly to a limiter employing a diode and a transistor in a novel configuration.

An object of the present invention is to provide a novel limiter for electric waves.

Another object of the present invention is to provide a diode in combination with one diode junction of a transistor in a novel manner to effect signal limiting and amplification of the limited signal by the transistor.

A further object of the present invention is to provide a novel solid state wave amplitude limiting device in which there is substantially no shift of direct current (D.C.) bias under large signal conditions with resulting unsymmetrical peak limiting and variations in the angle of conduction.

A still further object of the invention is to provide a novel solid state wave amplitude limiting device in which symmetrical amplitude limiting is obtained for a range of bias currents for the device not determined by the input impedance of a subsequent stage.

In accordance with the present invention, a diode and a transistor are associated in a novel manner to provide limiting in both directions of signal excursions. If desired, substantially symmetrical clipping may be readily obtained by the present invention. The elements of the diode and the base-emitter junction of the transistor of the same conductivity type are connected together. For example the N type element, the cathode, of the diode and the N type transistor base are connected together. Biasing means excites a transistor base current and a diode current which flow though a common impedance element. The transistor is biased normally for linear amplifier operation. Changes in input signal voltage to the diode-transistor combination cause corresponding and related changes in the relative values of diode current and base current flowing in the common impedance.

For the connection stated above by way of example, a positive going change in the input signal to the diode-transistor combination causes the current in the diode to increase with a corresponding decrease in base current until at approximately twice the quiescent diode current value the base current becomes zero. As the input signal increases further, there is no more change in base current until the signal drops to correspond to approximately twice the quiescent diode current or less.

For a negative going change in the input signal the diode current will decrease with a corresponding increase in the base current until the diode current becomes zero and the diode is cut off. At this signal voltage level, the base current will be approximately doubled. As the negative going input voltage increases further, there is no more change in base current since the diode remains in the cutoff state until the signal voltage drops back again to the level at which the diode begins to conduct.

The result of both signal excursions applied to the diode, transistor-base junction limiter is a symmetrically clipped base current. Since the transistor is a linear current amplifier a symmetrical amplified voltage will appear across the collector load.

The invention will be described in greater detail by reference to the accompanying drawing in which.

Figure 1:
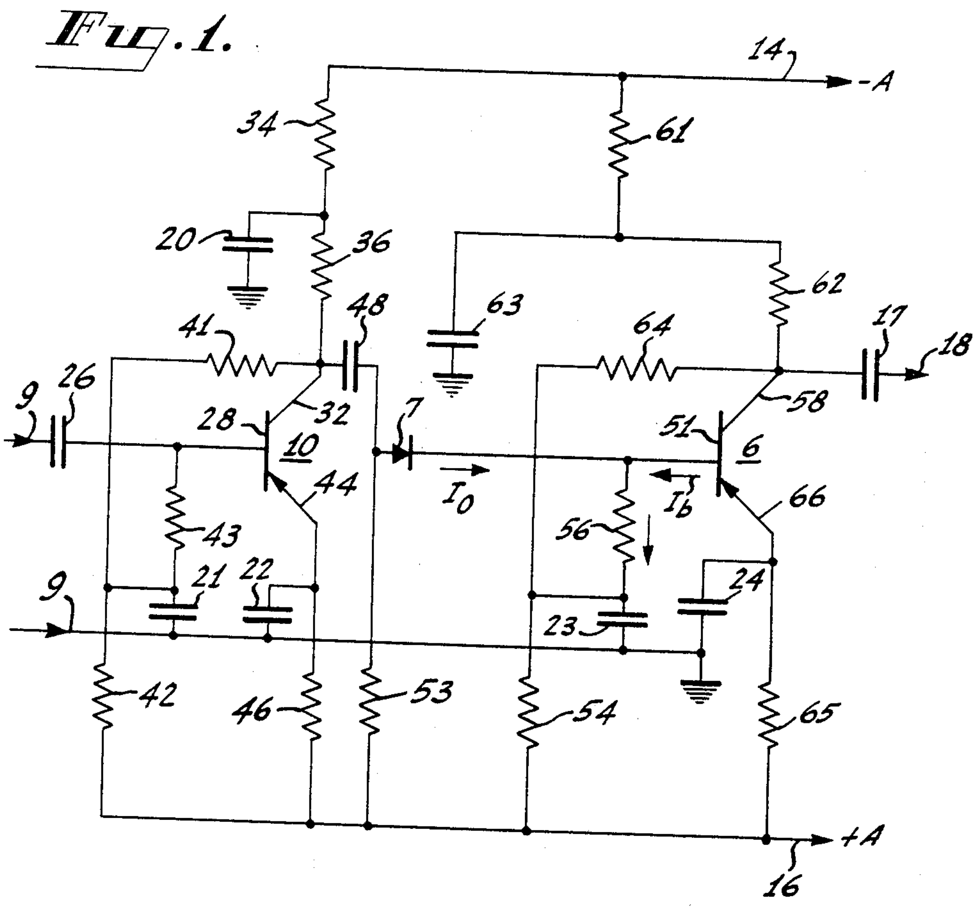
FIGURE 1 is a schematic diagram of an illustrative embodiment of the wave amplitude limiting device of the present invention.
Figure 3:
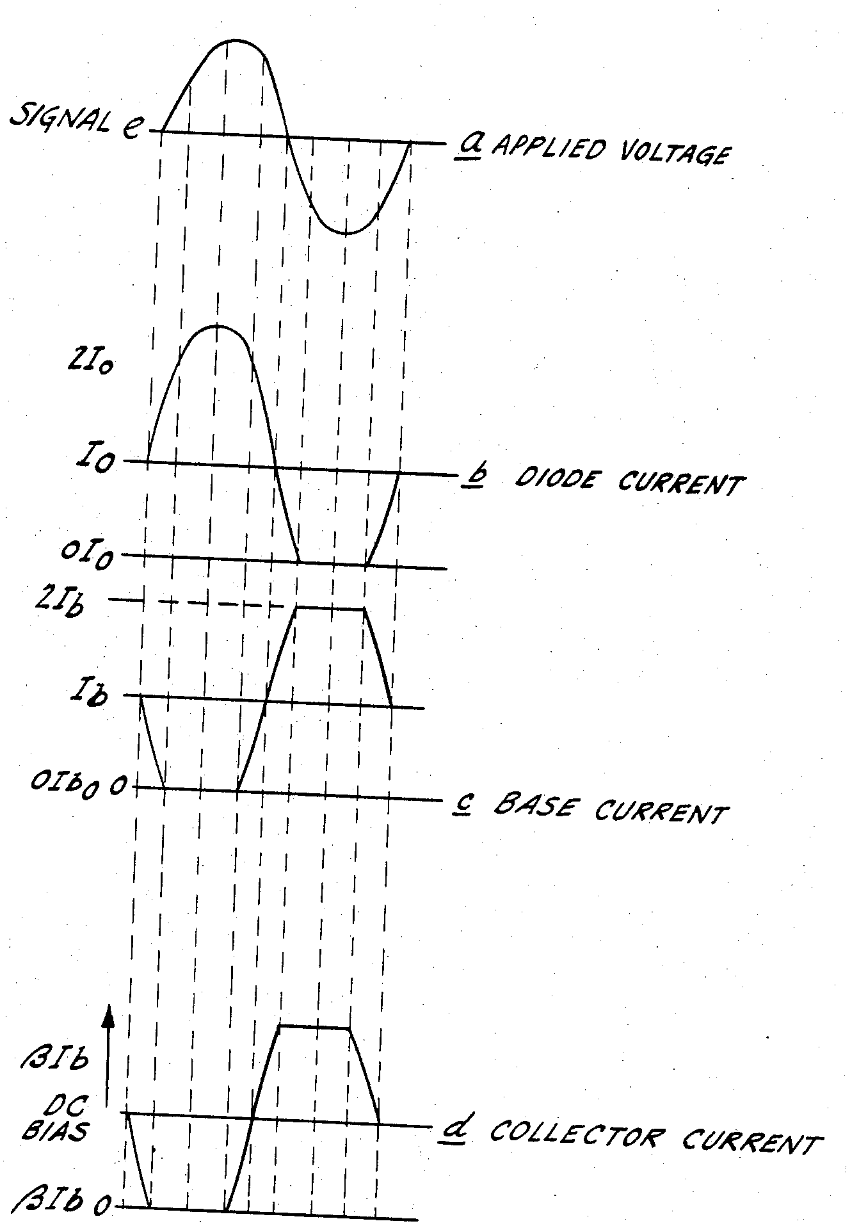

FIGURE 3, comprising FIGURES 3*a*, 3*b*, 3*c* and 3*d* shows waveforms referred to in explaining the operation of the device of FIGURE 1.

Referring to FIGURE 1 of the drawing, the limiter of the present invention comprises a transistor 6 and a diode 7. The output of an intermediate frequency (IF) source (not shown), for example, is coupled or connected to input terminals 9 for amplification by a substantially linear transistor amplifier comprising the transistor 10.

A connection from the negative terminal of suitable voltage of the voltage supply source (not shown) is made to the negative bias supply voltage conductor 14 and a connection from the positive terminal of suitable voltage is made to the positive bias supply conductor 16. Portions of the bias supply circuits and other sections of the apparatus (not shown) coupled to the input terminals 9, the output coupling capacitor 17, and an output connection 18, are connected to ground which may be chassis ground by capacitors 20, 21, 22, 23, 24 and 63 to provide complete alternating current (A.C.) paths.

The signal at the input terminals 9 is applied by way of a coupling capacitor 26 to the base 28 of the transistor 10. The transistor 10 is shown, illustratively, as being a PNP junction transistor. Negative biasing voltage for the collector 32 is provided from the conductor 14 through a voltage dropping resistor 34 and a load resistor 36. The previously mentioned capacitor 20 serves as a decoupling capacitor. Bias voltage for the base 28, negative with respect to the emitter, is obtained from a voltage divider composed of the resistors 41 and 42 connected between the collector 32 and the supply conductor 16 for stabilization purposes and a base bias resistor 43. The previously mentioned capacitor 21 prevents signal feedback from collector to base. Bias for the emitter 44 is provided by a resistor 46 connected to the supply conductor 16.

The signal, amplified by the transistor 10, is applied by way of a coupling capacitor 48 and the diode 7 to the base 51 of the transistor 6. A resistor 53 is connected between the anode of the diode and the supply conductor 16. The resistor 53 and a base bias resistor 56 cooperate in operation of the disclosed circuit to effect limiting. The resistors 64, 54, and 56 are connected in the same manner as resistors 41, 42 and 43, respectively. Capacitors 23 and 24 correspond in function to capacitors 21 and 22 respectively. The collector 58 is biased from the conductor 14 through a voltage dropping resistor 61 and a load resistor 62. The decoupling capacitor 63 is connected between the junction of resistors 61 and 62 and ground. An emitter bias resistor 65 is connected between the supply conductor 16 and the emitter 66.

In operation of the limiting device of this invention, the transistor 6 is biased for linear operation. Conventional current direction will be assumed. The quiescent D.C. base current $I_b$ will flow in the resistor 56. The forward bias through the resistor 53 to the anode of the diode is selected to cause a quiescent D.C. diode current $I_o$ to flow through the resistor 56 in the same direction as the current $I_b$. In the case of equal currents, the diode 7 and the base-to-emitter junction diode of the transistor 6 are, in effect, two similar forward biased diodes connected back to back.

Figure 2:
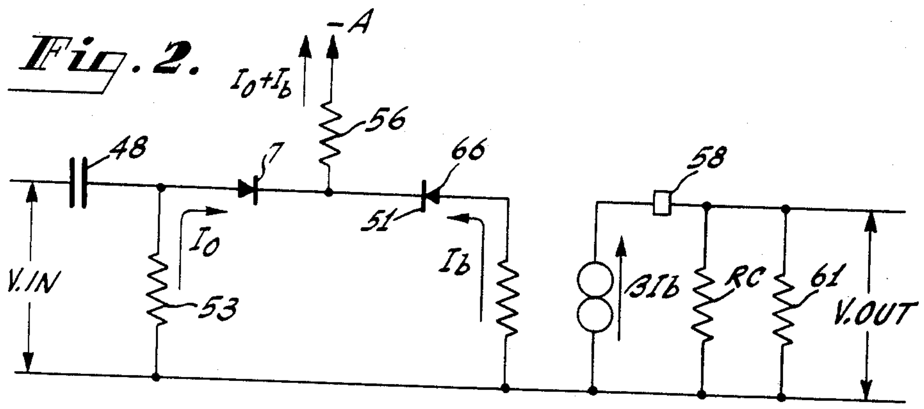
FIGURE 2 is a simplified equivalent circuit of the device of FIGURE 1.

The simplified equivalent circuit of FIGURE 2 and the waveforms of FIGURE 3 will be referred to in explaining the limiting operation more in detail. The showing of the components of FIGURE 2 corresponds to that of FIGURE 1, but simplified to show D.C. and A.C. paths without reference to ground or A.C. bypass capacitors. The same parts are designated by the reference characters of FIGURE 1.

When a relatively small sinusoidal signal V.IN is applied to the limiter by way of the capacitor 48 a correspondingly small sinusoidal current component will flow into the base 51 and will appear at the collector as $\beta I_b$ because of current amplification where $\beta$ is the current gain of the transistor. Depending on circuit adjustments, the signal V.OUT is an amplified replica of V.IN for relatively small signals.

FIGURE 3 shows limiter action when a relatively large signal voltage V.IN (FIGURE 3*a*) is applied. $I_o$ is the quiescent diode current in FIGURE 3*b* and $2I_o$ is approximately twice this value. As the signal voltage increases in a positive-going direction from zero, $I_o$ will increase (FIGURE 3*b*) with a corresponding decrease in $I_b$ as shown in FIGURE 3*c* in which $I_b$ is the quiescent value assumed equal to $I_o$. $I_b$ becomes zero when $2I_o$ is reached. As the input voltage increases further there is no more change in base current until the voltage falls to the level corresponding to $2I_o$ or less.

For the negative going half cycle as the voltage increases in a negative going direction, $I_o$ will decrease with corresponding increase in $I_b$ until $I_o$ becomes zero and the diode 7 is cut off. At this voltage level the base current will be approximately doubled since $I_o$ is then zero. As the input voltage increases further there is no more change in base current since the diode 7 remains cut off until the voltage returns to the level at which the diode 7 begins to conduct.

In FIGURE 3 it will be seen that the collector current $\beta I_b$ results from operation of the transistor 6 as a linear amplifier amplifying the waveform of the base current $I_b$ substantially without distortion and without needing to resort to any form of limiting in the collector circuit.

By way of example, the capacitors in FIGURE 1 of the drawing may have the following values:

| | Mfd. |
|---|---|
| Capacitor **17** | .0015 |
| Capacitor **20** | 0.10 |
| Capacitor **21** | 0.05 |
| Capacitor **22** | 0.05 |
| Capacitor **23** | 0.05 |
| Capacitor **24** | 0.05 |
| Capacitor **26** | .0015 |
| Capacitor **48** | .0015 |
| Capacitor **63** | 0.10 |

By way of example, the resistors may have the following values:

| | K ohms |
|---|---|
| Resistor **34** | 0.220 |
| Resistor **36** | 2.2 |
| Resistor **41** | 10 |
| Resistor **42** | 5.6 |
| Resistor **46** | 1.0 |
| Resistor **53** | 47 |
| Resistor **54** | 5.6 |
| Resistor **56** | 5.6 |
| Resistor **61** | 0.220 |
| Resistor **62** | 2.2 |
| Resistor **64** | 10 |
| Resistor **43** | 4.7 |
| Resistor **65** | 1.0 |

By way of example, transistor 6 is type 2N1180; transistor 10 is type 2N1180; and the diode 7 is type 1N295.

In FIGURE 1, NPN transistors can be used if polarity of the bias voltages is reversed and the diode is reversed by interchanging its cathode and anode connection.

The amplitude limiting device of this invention overcomes the limitations of known multistage transistor-limiters. These known limiters have the following disadvantages:

Shift of D.C. bias under large signal conditions with resulting unsymmetrical peak clipping and variations in the angle of conduction; and Extreme variation in input impedance with signal level when the transistor is allowed to operate between cutoff and full collector saturation with associated phase modulation that will further degrade amplitude modulation rejection in angle modulated communication systems.

Because of low impedance to the following stage, and low collector to emitter potential with subsequent loss of power gain at low level signals transistors have to be biased to heavy current drain in multistage resistance-capacitance coupled amplifiers-limiters.

What is claimed is:

1. A limiter circuit comprising:

a solid state amplifier having a base-emitter junction,
biasing means to bias said amplifier for linear current amplification,
a diode and means coupling said diode to said base,
means including an element in said limiter circuit energized from said biasing means to bias said base-emitter junction to conduct a quiescent current of predetermined magnitude flowing in said element and to bias said diode to conduct a quiescent current of predetermined magnitude also flowing in said element, and
means for applying an input signal through said diode to limit the base-emitter current to a predetermined maximum value for one direction of signal excursion and to reduce the base current to zero for the opposite direction of signal excursion whereby to provide a clipped base current for amplification by said amplifier.

2. A limiter circuit comprising:

a transistor amplifier having a base, a collector and an emitter,
means including an impedance element for applying a biasing voltage to said base from a current supply means,
means for applying a biasing voltage from said supply means to said emitter to cause a quiescent base-to-emitter direct current flow across the base-to-emitter junction of said transistor amplifier and through said impedance element,
a load impedance,
means to apply an operating bias to said collector through said load impedance from said supply means,
a diode and means coupling said diode to said base,
means including said impedance element to forward bias said diode to conduct diode current substantially equal in magnitude to said base-to-emitter current,
means for applying an input signal of said base in series with said diode,
said base-to-emitter current decreasing substantially to zero as said signal increases in magnitude in one direction and said diode current reaches substantially twice its quiescent value,
said diode current decreasing to substantially zero as said signal increases in magnitude in the opposite direction to limit said base current, and
an output connection to said limiter to provide a limited amplified output signal voltage.

3. A limiter circuit comprising:
a transistor amplifier having a base, a collector and an emitter,
a diode, and means coupling said diode to said base,
a first impedance element,
means including said first impedance element for applying a forward biasing voltage between said base and emitter whereby a quiescent base-to-emitter direct current flows in said impedance element,
means also including said first impedance element to forward bias said diode to conduct a quiescent diode current of a predetermined magnitude with respect to and in additive relationship with said base-to-emitter direct current in said impedance element,
means for applying an input signal having excursions in opposite directions of magnitude,
a second impedance element,
means to apply an operating bias to said collector through said second impedance element,
said diode current in said first impedance element reaching and exceeding a fixed maximum value for signal excursions beyond a predetermined magnitude in one excursion direction thereby to decrease said base-to-emitter current to zero to provide a clipped base-to-emitter waveform excursion in one direction of magnitude,
said diode current in said first impedance decreasing to zero for signal excursions beyond a predetermined magnitude in the opposite excursion direction thereby to increase said base-to-emitter current to a fixed maximum value to provide a clipped base-to-emitter waveform excursion in the opposite direction of magnitude,
and output connection means to said second impedance element and said collector to recover an amplified and limited signal voltage wave.

4. A limiter circuit comprising a transistor having base, emitter and collector electrodes,
means for connection to a source of biasing potential,
means to forward bias said base electrode with respect to said emitter electrode from said first named means to provide a quiescent base current,
said last named means including a resistor connected to said base and said first named means,
a diode,
means to forward bias said diode to provide a quiescent diode current,
means to apply a signal in series with said diode between said base electrode and said emitter electrode,
means providing for cutoff of said transistor base current upon excursions of said signal in one direction of signal polarity beyond a predetermined level to provide clipping of corresponding excursions of the signal at said collector,
means providing for limiting said diode current upon excursions of said signal in the opposite direction of signal polarity beyond a predetermined level to provide limiting of corresponding excursions of said signal at said collector, and
output connection means to said collector to recover an amplified and limited signal voltage wave.

5. A limiter circuit comprising:

a transistor amplifier having a base, a collector and an emitter,
a diode having a cathode and an anode,
means coupling said diode cathode to said base,
a first impedance element,
means including said first impedance element for applying a forward biasing voltage between said base and emitter whereby a base-to-emitter quiescent direct current flows in said impedance element,
means also including said first impedance element to forward bias said diode to conduct a quiescent diode current of a predetermined magnitude with respect to and in additive relationship with said base-to-emitter direct current in said impedance element,
means for applying an input signal having excursions in opposite directions of magnitude,
a second impedance element,
means to apply an operating bias to said collector through said second impedance element,
said diode current in said first impedance element reaching and exceeding a fixed maximum value for signal excursions beyond a predetermined magnitude in one excursion direction thereby to decrease said base-to-emitter current to zero to provide a clipped base-to-emitter waveform excursion in one direction of magnitude,
said diode current in said first impedance decreasing to zero for signal excursions beyond a predetermined magnitude in the opposite excursion direction thereby to increase said base-to-emitter current to a fixed maximum value to provide a clipped base-to-emitter waveform excursion in the opposite direction of magnitude,
and output connection means to said second impedance element and said collector to recover an amplified and limited signal voltage wave.

6. A limiter circuit comprising:
a PNP transistor amplifier having a base, a collector and an emitter,
means including an impedance element for applying a biasing voltage to said base from a current supply means,
means for applying a biasing voltage from said supply means to said emitter to cause a quiescent direct current flow across said base-to-emitter junction and through said impedance element,
a load impedance,
means to apply an operating bias to said collector through said load impedance from said supply means,
a diode having cathode of N type and anode electrodes and means coupling said diode cathode electrode to said base,
means including said impedance element to forward bias said diode to conduct diode current substantially equal in magnitude to said base-to-emitter current,
means for applying an input signal to said base in series with said diode,
said base-to-emitter current decreasing substantially to zero as said signal increases in magnitude in one direction of said diode current reaches substantially twice its quiescent value,
said diode current decreasing to substantially zero as said signal increases in the opposite direction to limit said base current, and
an output connection to said limiter to provide a limited amplified output signal voltage.

References Cited

UNITED STATES PATENTS

| | | | |
|---|---|---|---|
| 3,031,623 | 4/1962 | Custin et al. | 307—88.5 XR |
| 3,052,853 | 9/1962 | Smith | 307—88.5 XR |
| 3,058,008 | 10/1962 | Clapper | 307—88.5 |

ARTHUR GAUSS, *Primary Examiner.*

J. ZAZWORSKY, *Assistant Examiner.*